United States Patent [19]

Rittenbach

[11] 4,237,464
[45] Dec. 2, 1980

[54] RADAR ANTENNA EMPLOYING PHASE SHIFTED COLLINEAR DIPOLES

[75] Inventor: Otto E. Rittenbach, Neptune, N.J.

[73] Assignee: The United States of America as represented by the Secretary of the Army, Washington, D.C.

[21] Appl. No.: 973,642

[22] Filed: Dec. 26, 1978

[51] Int. Cl.³ .............................................. H01Q 3/26
[52] U.S. Cl. ..................................... 343/814; 343/854
[58] Field of Search ............... 343/815, 816, 817, 818, 343/854, 853, 814

[56] References Cited

U.S. PATENT DOCUMENTS

| | | | |
|---|---|---|---|
| 1,934,412 | 11/1933 | Enclund | 343/818 |
| 2,558,727 | 7/1951 | Bernet | 343/815 |
| 3,056,961 | 10/1962 | Mitchell | 343/854 |
| 3,160,887 | 12/1964 | Broussaud et al. | 343/854 |
| 3,172,111 | 3/1965 | Breetz | 343/854 |
| 3,500,423 | 3/1970 | Church | 343/873 |
| 3,803,621 | 4/1974 | Britt | 343/854 |
| 4,063,250 | 12/1977 | Fenwick | 343/854 |

*Primary Examiner*—Eli Lieberman
*Attorney, Agent, or Firm*—Nathan Edelberg; Jeremiah G. Murray; Daniel D. Sharp

[57] ABSTRACT

An antenna array radiation pattern switching system suitable for use in range-gated, pulse doppler, radar systems. The antenna array includes first and second antennas, one of which is fed through a fixed phase-shift network while the other is fed through a phase-shift network with double the phase shift of the fixed phase-shift network that can selectively be switched in and out of the feed circuit.

4 Claims, 4 Drawing Figures

RADAR ANTENNA EMPLOYING PHASE SHIFTED COLLINEAR DIPOLES

GOVERNMENT LICENSE

This invention may be manufactured by or for the Government, for governmental purposes, without the payment of any royalties thereon or therefor.

TECHNICAL FIELD

Broadly speaking, this invention relates to radar. More particularly, in a preferred embodiment, this invention relates to an improved antenna radiation pattern switching means for use with a range-gated, pulse doppler radar system, or the like.

BACKGROUND OF THE INVENTION

My co-pending application, Ser. No. 973,356, filed Dec. 26, 1978, describes a lightweight, portable, military radar system especially adapted for use in jungle warfare. One of the difficulties with designing such a system is the configuration of the antenna, which must satisfy several conflicting requirements. First, because the radar cross-section of a man reaches a broad peak at about 200 MHz, the antenna must be optimized for that band. Second, because the radar system with which the antenna is to work is a Doppler system, the antenna is non-rotating; therefore, it must have as broad a beam as possible. However, notwithstanding the above, since the antenna must be portable and capable of easy erection in the field, it must not be physically large or unduly heavy.

In the aforementioned, co-pending application, which application is hereby incorporated by reference as if fully set forth herein, the antenna system employed comprises a pair of 5½ foot log-periodic yagi antennas each having a beam-width of 12°. The two yagis are angled at 45° to each other to yield an effective beam-width of 55°.

Unfortunately, this arrangement is unsatisfactory for actual field deployment as it is difficult to align and present a relatively large cross-section to the wind, resulting in unwanted doppler modulation in anything stronger than a light breeze.

As a solution to the above and other problems, the instant invention comprises a first, shortened, half-wave dipole and second, shortened, half-wave dipole co-axial with and contiguous to said first dipole, and first and second reflecting screens respectively positioned proximate said first and second dipoles and normal to the plane of polarization of said antenna. The invention, however, is not limited to dipole antennas; for example, horn antennas or parabolic reflector antennas may be used.

The invention and its mode of operation will be more fully understood from the following detailed description, when taken with the appended drawings, in which:

DETAILED DESCRIPTION

Figure 1:
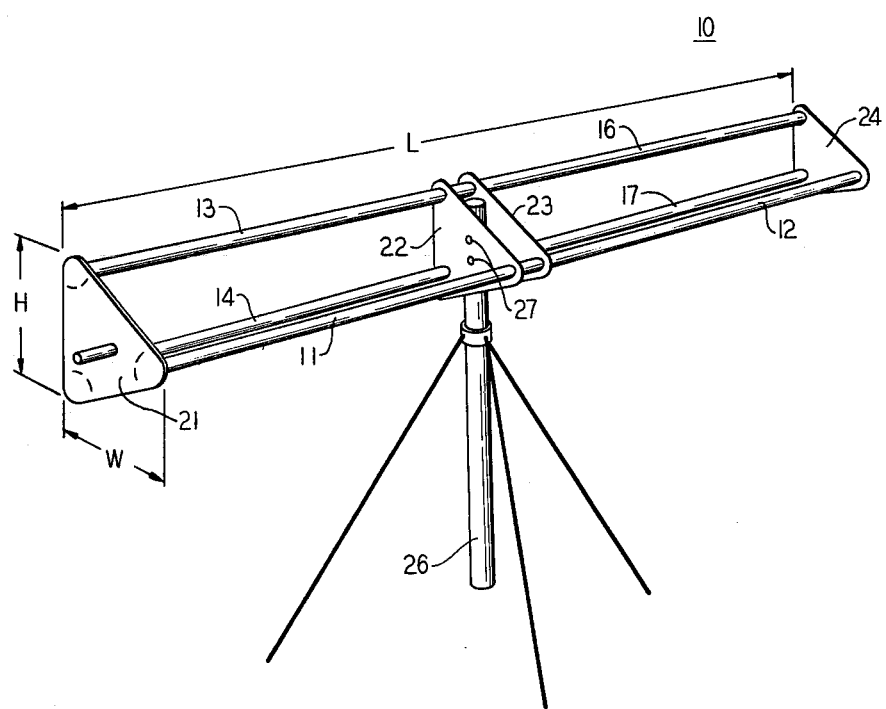
FIG. 1 is an isometric view of an illustrative radar antenna according to the invention.

FIG. 1 depicts an illustrative antenna according to the invention. As shown, antenna 10 comprises first and second, shortened, half-wave dipoles 11 and 12, advantageously fabricated from a continuous fiberglass rod or tubing. The antenna includes two reflecting screens, one comprising a pair of parasitic elements 13 and 14 and the other comprising a similar pair of parasitic elements 16 and 17. Advantageously, the parasitic elements are also fabricated from fiberglass rod or tubing.

The three continuous rods which comprise the dipoles and parasitic elements are supported by four triangular, non-conducting plates 21, 22, 23 and 24, respectively. The portions of the rods which act as the antenna or reflectors are metallized, e.g. with aluminum, except for the central portions lying between plates 22 and 23, which must, of course, remain non-conducting.

Figure 2:
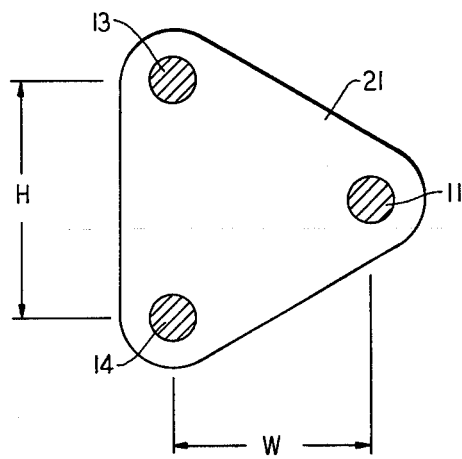
FIG. 2 is a cross-sectional view of the antenna shown in FIG. 1.

FIG. 2 is a cross-sectional view of the antenna shown in FIG. 1 which depicts the spatial relationship of the dipoles and reflectors in greater detail. For use in the 200 MHz band, typical antenna dimensions are L=46 inches, H=6 inches and W=6 inches. The antenna is advantageously supported by a guyed pole 26 secured by rivets or machine screws 27 to plates 22 and 23.

Figure 3:
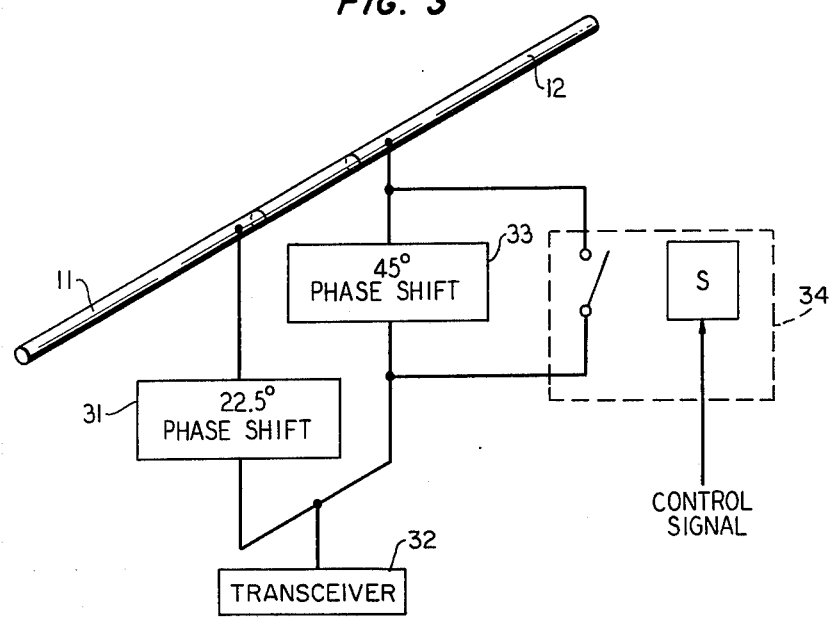
FIG. 3 is a partially schematic, partially diagrammatic diagram of an antenna array radiation pattern switching system using the antenna shown in FIG. 1

An antenna array radiation pattern switching system is shown in FIG. 3. A first antenna (dipole 11) is excited by means of a feeder attached to one end thereof. A fixed degree phase shift network 31 is interposed between a transceiver 32 and dipole 11. In like manner, a variable phase shift network 33 is interposed in the feed from transceiver 32 to dipole 12 and has a phase shift twice that of the fixed phase shift network. By way of example, phase shifts of 22½ degrees and 45 degrees are indicated in FIG. 3.

An electronic single-pole, single-throw switch 34 is connected across phase-shift network 33 to selectively remove the same from the feed line. Thus, with the switch 34 open, the feed to dipole 12 will lag behind the feed to dipole 11 and, in accordance with known principles, the radiation pattern of the two dipoles combined will be inclined to the left. Similarly, when switch 34 is closed, the feed to dipole 11 will lag behind the feed to dipole 12 by 22½ degrees and the radiation pattern will now be biased to the right.

Pattern measurements made on an actual model demonstrated that by alternately opening and closing switch 34, the desired 55° beam pattern could be obtained with unwanted sidelobes being held to 20 dB relative to the main beam.

Figure 4:
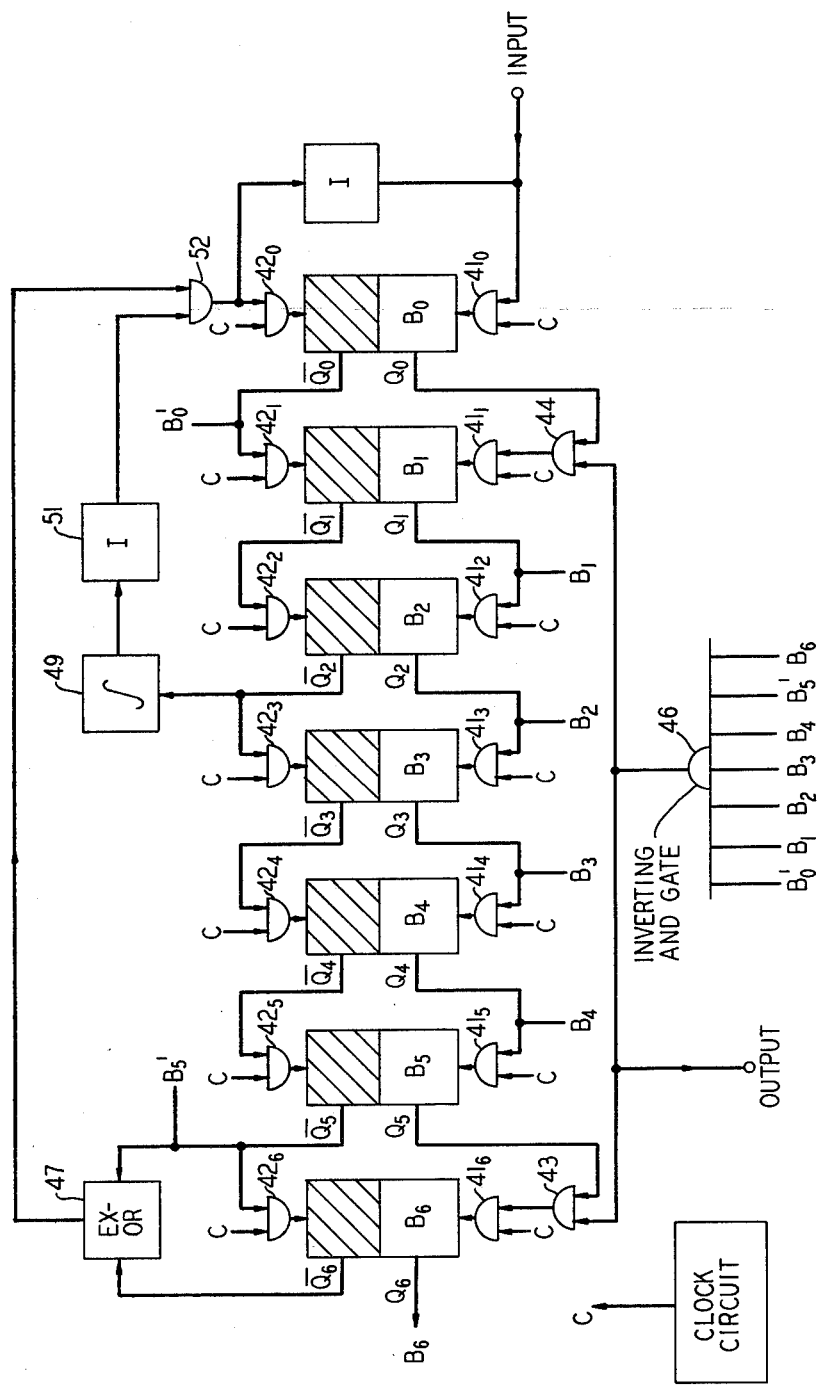
FIG. 4 is a block schematic diagram of an illustrative binary counter for use with the radar system employing the antenna of FIG. 1.

The above-discussed, co-pending application includes circuitry for generating a periodic pulse train having $2^N-1$ bits per period. K bits are transmitted, then M bits are passed over, then K more bits are transmitted, etc. the sum (K+M) and the number $2^N-1$ must not have any primary factors in common. A binary counter is used to count the number of bits to be passed over and FIG. 4 depicts an illustrative 89-bit suitable for this purpose.

The question is, what type of counter will best fill the requirements of the pulse generator? The requirements are a minimum; the counter need only count to 89, reset (before the next clock pulse), count to 89 again, ad infinitum. The only indication necessary is a pulse, indicating that the count of 89 has been reached. The result is a series of pulses spaced 89 bits apart. The minimum number of multivibrators necessary to meet these requirements is seven. The number and type of gates will depend on the counter type.

The most straight forward approach is a gated binary counter, however, as is well known, in such a counter the gate size tends to get very large, i.e. many inputs per gate. By grouping similar signals, the gate size may be decreased, but then the gates must be cascaded. Regardless of how the signals are grouped, such a counter requires many components, and hence is unattractive.

A binary-coded decimal counter could also be used but would have no advantage in this case. Such a counter requires more multivibrators and more gates. The only practical advantage is the ease of obtaining a base ten indication of the count.

A binary counter which is less complicated than the logic gated binary counter is one in which a the clock pulses can be gated. The only real problems that might arise with such a counter are clock delay and clock degradation as the clock pulse travels along the counter. The delay of one clock pulse gate multiplied by seven gates, added to the delay of the last multivibrator is likely to become appreciable compared to 200 nanoseconds (the clock period). Even if it were possible to build a gate that operated fast enough, each gate would use at last one transistor and the design of the gate would be a considerable task.

Perhaps the simplest binary counter is the complementing counter which, of course, uses the output of the preceding multivibrator as a clock pulse for the following multivibrator. If this type of counter could be made to work at 5 MHz, it would be the simplest to build. Unfortunately, in such a counter not only do the delays of the multivibrators add, but the rise times of the multivibrators are greater than that of the clock pulse generator. This increases the delay of an individual multivibrator. However, the total delay of the counter cannot be greater than 200 nanoseconds because, after a count of 128 is reached, the counter must be reset to 39 before the next clock pulse arrives, in order to count to $128-39=89$.

The counter chosen is unique. As shown in FIG. 4, this counter uses a shift register with linear feedback which is connected to generate a maximal length pseudo-random sequence. When a given state in the sequence is sensed, certain shifts are inhibited, and the register is returned to the all-one state. The number of clock pulses needed to complete this period is 89. In this counter, the gates are very simple and propagation time problems are minimized. As shown, the counter comprises 7 multivibrators, $B_0$–$B_6$. An And-gate $41_0$–$41_6$ and another And-gate $42_0$–$42_6$ are associated with the set and reset inputs to each multivibrator, respectively. The input to each of gates $41_2$–$41_5$ are the clock pulses C and the Q output of the preceding stage. The inputs to gates $41_1$ and $41_6$ are the clock pulses C and the output of And-gates 43 and 44, respectively. One input to gates 43 and 44 is the output of the previous stage while the other inputs are the output of an 8 input, inverting And-gate 46 which has as its input the multivibrator outputs $B'_0$, $B_1$, $B_2$, $B_3$, $B_4$, $B'_5$ and $B_6$.

The inputs to the gates $42_0$–$42_6$ are the clock pulses and the $\overline{Q}$ outputs of the previous stage.

The 89 bit counter shown in FIG. 4 is a seven-stage linear shift register sequence generator. When the contents of the register is $B'_0$, $B_1$, $B_3$, $B_4$, $B'_5$ and $B_6$, $Q_1$ becomes false. $Q_1$ inhibits the shift of zeroes in $B_0$ and $B_5$ to $B_1$ and $B_6$, respectively. Inhibiting these zeroes from shifting fills the register with ones. $Q_1$ then becomes true and the register generates code until $B'_0$, $B_1$, $B_2$, $B_3$, $B_4$, $B'_5$ and $B_6$ become true again. This process repeats every 89 clock pulses.

The exclusive-or circuit 47 used in the counter performs modulo-two addition. Referring to FIG. 4, the exclusive-or has two inputs. If these inputs are equal and at zero volts or $-3.5$ volts, the output of the "exclusive or" will be held at $-3.5$ volts), the output will be held at approximately zero volts.

If the shift register contains all zeroes, the register will not generate code. To prevent this condition, an integrator 49 and an inverter circuit 51 are included. If code is being generated, the output level of integrator 51 is half-way between $-3.5$ volts and ground. If zeroes fill the register, the output of the integrator is $-3.5$ volts. Inverter 51 senses the integrator output. If zeroes fill the register, output of the inverter goes to zero volts. When code is being generated, the output of the inverter is at $-3.5$ volts.

The circuit also includes an "or" gate 52. The output of inverter 51 drives one input of or-gate 52 and the output of "exclusive-or" 47 drives the other input. If zeroes fill the register, the output of "exclusive-or" 47 is zero but the output of inverter 51 is one. The output of "or" gate 52 in this case is one, and since the "or" gate drives the input of the register, the register fills with ones. The generator has thus been prevented from stalling with a load of zeroes.

"And" gate 46 senses the register and indicates that the count of 89 is reached. The output of gate 46 is used as a driver to "And" gates 43 and 44 which are the gates used to inhibit the zeroes from shifting when the proper count is reached.

One skilled in the art can make various changes and substitutions to the layout of parts shown without departing from the spirit and scope of the invention.

What is claimed is:

1. An antenna array radiation pattern shifting system comprising first and second half-wave antennas colinearly disposed in a common plane;
   a fixed phase shifting means connected to said first antenna;
   a second variable phase shifting means connected to said second antenna;
   the phase shift introduced by said variable phase shifting means being substantially double the phase shift introduced by said fixed phase shifting means; and
   switching means for selectively bypassing the second phase shifting means for changing the direction of said antenna array radiation pattern.

2. An antenna array radiation pattern shifting system according to claim 1 wherein said switching means includes an electronic single-pole, single-throw switch energized by a control signal.

3. An antenna array radiation pattern shifting system according to claim 1 wherein said fixed and second phase shifting means introduce a phase shift of 22.5 degrees and 45 degrees, respectively.

4. An antenna array radiation pattern shifting system according to claim 1 wherein said first and second antennas are axially aligned dipoles.

* * * * *